United States Patent
Sunaga et al.

(10) Patent No.: US 11,542,377 B2
(45) Date of Patent: Jan. 3, 2023

(54) BENDABLE CIRCUIT BOARD, EXPANDABLE CIRCUIT BOARD, AND ELECTRONIC DEVICE MADE THEREFROM

(71) Applicant: Mitsui Chemicals, Inc., Tokyo (JP)

(72) Inventors: Tadahiro Sunaga, Yamato (JP); Jun Okabe, Tokyo (JP); Shizuo Tokito, Yonezawa (JP); Koji Yokosawa, Yonezawa (JP)

(73) Assignee: Mitsui Chemicals, Inc., Tokyo (JP)

( * ) Notice: Subject to any disclaimer, the term of this patent is extended or adjusted under 35 U.S.C. 154(b) by 53 days.

(21) Appl. No.: 17/283,821
(22) PCT Filed: Oct. 25, 2019
(86) PCT No.: PCT/JP2019/041835
§ 371 (c)(1),
(2) Date: Apr. 8, 2021
(87) PCT Pub. No.: WO2020/090634
PCT Pub. Date: May 7, 2020

(65) Prior Publication Data
US 2022/0002507 A1    Jan. 6, 2022

(30) Foreign Application Priority Data

Oct. 31, 2018    (JP) .............................. JP2018-204920

(51) Int. Cl.
| | | |
|---|---|---|
| *H05K 1/18* | (2006.01) | |
| *C08J 5/18* | (2006.01) | |
| *C08G 18/75* | (2006.01) | |
| *H05K 1/02* | (2006.01) | |
| *H05K 1/03* | (2006.01) | |

(52) U.S. Cl.
CPC .............. *C08J 5/18* (2013.01); *C08G 18/757* (2013.01); *H05K 1/028* (2013.01); *H05K 1/0283* (2013.01);
(Continued)

(58) Field of Classification Search
CPC ....... C08J 5/18; C08J 2375/04; C08G 18/757; H05K 1/028; H05K 1/0283; H05K 1/0346;
(Continued)

(56) References Cited

U.S. PATENT DOCUMENTS

2016/0331261 A1    11/2016   Someya et al.
2017/0181276 A1     6/2017   Sawada et al.
(Continued)

FOREIGN PATENT DOCUMENTS

JP       2003-147196 A      5/2003
JP       2013237714 A      11/2013
(Continued)

*Primary Examiner* — Binh B Tran
(74) *Attorney, Agent, or Firm* — Rankin, Hill & Clark LLP

(57) ABSTRACT

Provided are an expandable or bendable circuit board having good body-contact feel, strong against bending and folding, and an electronic device made therefrom. The bendable circuit board includes: a film comprising a polyurethane synthesized by reacting a long-chain polyol with polyisocyanate and having a storage modulus at 25° C. of 20 to 200 MPa, a tensile strength of 20 to 80 MPa, and an elongation at break of 500 to 900%, and the temperature of which the storage elastic modulus reaches to 1 MPa is at 155° C. or higher; and circuit wiring formed in contact with a surface of the film. Alternatively, an expandable circuit board having the ratio $\rho/\rho_0$ of the specific electrical resistance $\rho$ of the circuit wiring when the circuit wiring is expanded to the specific electrical resistance ($\Omega \cdot$cm) $\rho_0$ of the circuit wiring before the circuit wiring is expanded is within a range of 1.05 to 10.0.

14 Claims, 3 Drawing Sheets

(52) U.S. Cl.
CPC ......... *H05K 1/0346* (2013.01); *H05K 1/0393* (2013.01); *C08J 2375/04* (2013.01); *H05K 2201/10098* (2013.01); *H05K 2201/10151* (2013.01)

(58) Field of Classification Search
CPC ....... H05K 1/0393; H05K 2201/10098; H05K 2201/10151
See application file for complete search history.

(56) References Cited

U.S. PATENT DOCUMENTS

| | | |
|---|---|---|
| 2018/0192948 A1 | 7/2018 | Okumura et al. |
| 2019/0053546 A1 | 2/2019 | Nakao et al. |
| 2019/0077930 A1 | 3/2019 | Irie et al. |

FOREIGN PATENT DOCUMENTS

| | | | |
|---|---|---|---|
| JP | 5594451 B1 | | 9/2014 |
| JP | 2014-236103 A | | 12/2014 |
| JP | 2016-115728 A | | 6/2016 |
| JP | 2017-22237 A | | 1/2017 |
| JP | 2017-118109 A | | 6/2017 |
| JP | 2017-168437 A | | 9/2017 |
| JP | 2018-160512 A | | 10/2018 |
| KR | 20140101829 A | * | 8/2014 |
| WO | 2015/119197 A1 | | 8/2015 |
| WO | 2017/159456 A1 | | 9/2017 |
| WO | 2017/183497 A1 | | 10/2017 |

* cited by examiner

BENDABLE CIRCUIT BOARD, EXPANDABLE CIRCUIT BOARD, AND ELECTRONIC DEVICE MADE THEREFROM

TECHNICAL FIELD

The present invention relates to a bendable wiring board, a wiring board capable of stretching and shrinking (hereinafter simply referred to as "elastic wiring board") and electronic devices provided with the wiring boards.

BACKGROUND ART

In recent years, printed electronics obtained by using printing technologies are attracting attention in the field of electronic devices. Particularly, a method of the printing technology in which wiring is formed by drawing on a board with a metal particle ink or paste that can form wiring by applying, and heating and firing the metal particle ink or paste is considered to be an industrially critical technology because the method can significantly reduce the cost and environmental load as compared to a conventional vacuum process. Active development of materials and devices for the method is thus underway. Research and development is also underway in printed electronics which draw wiring by printing with a conjugated organic conductive ink and heat-treat the ink.

The target markets in these technological backgrounds are the fields of trillion sensors (the field extends in a wide variety of applications such as printed electronics, lasers, images, and the like), organic EL and organic transistors, and the fifth generation society (super smart society)—Society 5.0—aiming for 2020 to 2030. Technological innovation is believed to be required so that issues such as population decline, aging society, energy, environment, disaster, terrorism, widening of regional disparity as problems in the future will be reduced or resolved by the fourth industrial revolution (IoT, big data, artificial intelligence (AI), robots and the like).

In order to solve these issues, it is necessary to provide various electronic circuit products to society in large quantities and at low cost. Sensors other than the printed electronics are currently priced at, for example, 100,000 to 500,000 yen/sensor module, and the price gap relative to the price of less than 500 yen/sensor module, which would be a price required by users in the future, is not eliminated.

Printed electronics are an essential technical element as a flexible hybrid electronics for inexpensively obtaining flexible products or parts while maintaining high performance by combining or hybridizing flexible printed wiring with integrated circuits (ICs) produced by conventional lithography technology. This concept is a technology proposed mainly from the United States. The technology can provide a whole product with excellent physical properties such as weight reduction, thinness, and toughness (impact resistance), in addition to low cost and high performance, and thus expected to be used for unprecedented purposes. However, as board materials used for flexible printed wiring, highly rigid and hard plastics are used, such as polyethylene terephthalate (PET), polyethylene naphthalate (PEN), polyetheretherketone (PEEK), polyphenylene sulfide (PPS), polyarylate (PAR), polyimide (PI), polycarbonate (PC), cellulose triacetate (TAC), and cellulose acetate propionate (CAP) (see Patent Literature (hereinafter, referred to as PTL) 1). Wiring boards produced from these materials do not return to their original shape after being bent. In addition, such a wiring board has a low adhesion between metal wiring and its board, and the metal wiring may be peeled off from the board due to stress from the board and may be broken. A bendable wiring board or an elastic wiring board thus cannot be obtained from these materials.

Furthermore, in order to solve the above-described future problems, interest in biosensors of wearable devices and medical devices and biometric information monitoring are increased. Attempts are being made to attach such a biosensor to a human body to sense human movement, or to detect vital signs (biological information) such as electrocardiogram, heart rate, blood pressure and body temperature. These biosensors and biometric information monitors are typically attached to clothes, orthoses, bedding and the like for sensing and monitoring.

However, a biosensor or a biometric information monitor provided on clothes or an orthosis moves away from the target part of the living body due to the movement of the human body, thus significantly reducing the sensing or monitor accuracy. Such reduction in the accuracy can be avoided by attaching the biosensor or biometric monitor directly to the human body. In recent years, a technique called elastic (or stretchable and shrinkable) electronics, which have a base material and wiring material both having elasticity in the in-plane direction, is studied, and a wiring board that can stretch and shrink according to the movement of a joint or the like of a human body has been proposed. PTL 2 describes a circuit board having elasticity in its entire board, which is composed of an elastic base material and a conductive pattern containing conductive fine particles and an elastomer. However, the stretchable board material described in PTL 2 has low heat resistance, and cannot be heated at a temperature of about 120° C., after pasting to print the conductive fine particles and the elastomer on the stretchable board material with a high boiling point solvent. As a result, the conductive fine particles cannot be sufficiently sintered, and sufficient conductivity cannot be exhibited.

PTL 3 discloses, for drawing conductive wiring by plating or printing the same, a resin composition for forming a receiving layer, as well as a receiving base material, a printed matter, a conductive pattern and an electric circuit obtained by using the resin composition. The resin composition includes a urethane resin having a vinyl polymer in the side chain and has a crosslinked structure formed therein to improve durability. The object of PTL 3 is to provide a resin composition for forming a receiving layer having excellent printability. The resin composition forms an ink receiving layer with excellent adhesion to various supports, among receiving layers (crosslinked urethane resins) which are capable of supporting the fluid of a pigment ink and a conductive ink.

PTL 3 describes that the receiving layer made of urethane resin, which to be formed a crosslinked structure after printing with the fluid, has a resistance to plating agents and various organic solvents, so that bleeding to the fluid and peeling of the pigment ink and conductive ink can be prevented, or durability of the pigment ink and conductive ink to fluid can be obtained. The urethane resin of PTL 3 has a structure such that a structure derived from a vinyl polymer is grafted on a side chain of a structure of urethane resin as a main chain. Durability is exhibited by using a heat-crosslinked hybrid resin composition of the vinyl polymer/urethane resin. Specifically, PTL 3 uses a composition obtained by allowing a urethane resin to react with a polyol containing a vinyl polymer having two hydroxyl groups at one end and a polyisocyanate, and a chain extender, if necessary.

CITATION LIST

Patent Literature

PTL 1
Japanese Patent Application Laid-Open No. 2016-115728
PTL 2
Japanese Patent Application Laid-Open No. 2014-236103
PTL 3
Japanese Patent No. 5594451

SUMMARY OF INVENTION

Technical Problem

The composition for forming a receiving layer in PTL 3 cannot be used by itself. That is, the ink application cannot be performed unless the ink receiving layer is formed through a complex process in which the composition for forming a receiving layer and an aqueous medium are applied or impregnated on part or all of one or both sides of a support as a receiving base material for the ink, and the aqueous medium contained in the applied surface is volatilized. PTL 3 also suggests that it is preferable to use a support made of a polyimide resin, polyethylene terephthalate, polyethylene naphthalate, glass, cellulose nanofibers, or the like, which is often used as a support, for forming a conductive pattern of a typical circuit board or the like. However, these materials generally have little adhesiveness, and thus it is often difficult for the resin or the like to adhere to these materials.

PTL 3 further suggests that, in the case of applications required flexibility, the use of support, which is relatively flexible and bendable, is preferable to give a flexibility for a conductive pattern and for obtaining a bendable final product. Specifically, PTL 3 suggests that it is preferable to use a film or sheet-like support formed by uniaxial stretching or the like. Even if a stretched film as exemplified in PTL 3 such as polyethylene terephthalate (PET) film and polyimide (PI) film and polyethylene naphthalate (PEN) film or the like could be used, with the use of these stretched difficult support and while suppressing migration over time due to residual moisture in the composition for forming a receiving layer containing an aqueous medium of a pigment or a conductive ink, it is obvious that requires more advanced technologies and equipment and has a big problem in quality control in order to provide cheaply a large amount of electric circuits as conductive patterns and final products to society.

As described above, printed electronics are considered to be an industrially critical technology, and active development therefor is underway. Inexpensive bendable wiring boards and elastic (stretchable and shrinkable) wiring boards each formed by drawing circuit wiring by a coating and printing technology and firing (or sintering), and bendable or elastic (stretchable and shrinkable) electronic devices having a sensor function and a short-range wireless communication function on these wiring boards thus can be used for welfare medical applications, wearable device applications, RFID applications, transistor applications for, for example, smartphones, tablet terminals, computers and displays, applications of sensors or control parts for, for example, medical and nursing beds, crime prevention, childcare, autonomous driving, pet robots and drones, and applications of electronic parts for, for example, organic EL, liquid crystal displays, lighting, automobiles, robots, electronic glasses and music players. In addition, as one of the solutions to the future problems it is necessary to provide electronic devices with a bendability, flexibility and a sensor function with a suitable texture a soft contact feeling and followability to the movement of the human body, and wireless communication function.

An object of the present invention is to provide a bendable wiring board with elasticity or an elastic wiring board, each of which has an excellent contact feeling for a human body and is extremely resistant to bending and folding, and also an electronic device provided with such a wiring board.

Solution to Problem

The present invention relates to a bendable wiring board including: a film composed of a polyurethane to be synthesized by allowing a long-chain polyol to react with a polyisocyanate, in which a temperature of the polyurethane at which a storage elastic modulus measured by a dynamic viscoelasticity measurement becomes 1 MPa is 155° C. or higher, and the polyurethane has the storage elastic modulus of 20 to 200 MPa at 25° C., a tensile strength of 20 to 80 MPa, and elongation at break of 500 to 900%; and circuit wiring formed so as to be in contact with a surface of the film.

The present invention also relates to an elastic wiring board including: a film composed of a polyurethane to be synthesized by allowing a long-chain polyol to react with a polyisocyanate, in which a temperature of the polyurethane at which a storage elastic modulus measured by a dynamic viscoelasticity measurement becomes 1 MPa is 155° C. or higher, and the polyurethane has the storage elastic modulus of 20 to 200 MPa at 25° C., a tensile strength of 20 to 40 MPa, and elongation at break of 500 to 900%; and circuit wiring formed so as to be in contact with a surface of the film, in which a ratio $\rho/\rho_0$ between a specific electrical resistance ($\Omega \cdot cm$) $\rho_0$ of the circuit wiring before the circuit wiring is stretched and a specific electrical resistance p of the circuit wiring when the circuit wiring is stretched and changed is in a range of 1.05 to 10.0.

The present invention further relates to a bendable or elastic electronic device including the bendable wiring board or the elastic wiring board, a sensor that measures a predetermined physical quantity, and a short-range wireless communication device.

Advantageous Effects of Invention

The present invention can provide a bendable wiring board with elasticity or an elastic wiring board, each of which has an excellent contact feeling for a human body and is extremely resistant to bending and folding. The present invention can also provide a bendable or elastic electronic device having a sensor function and a short-range wireless communication function on the wiring board. It can be thus expected to obtain highly transparent electronic components and the like which have high flexibility and elasticity, and suffer no yellowing over time.

DESCRIPTION OF EMBODIMENTS

Figure 1:
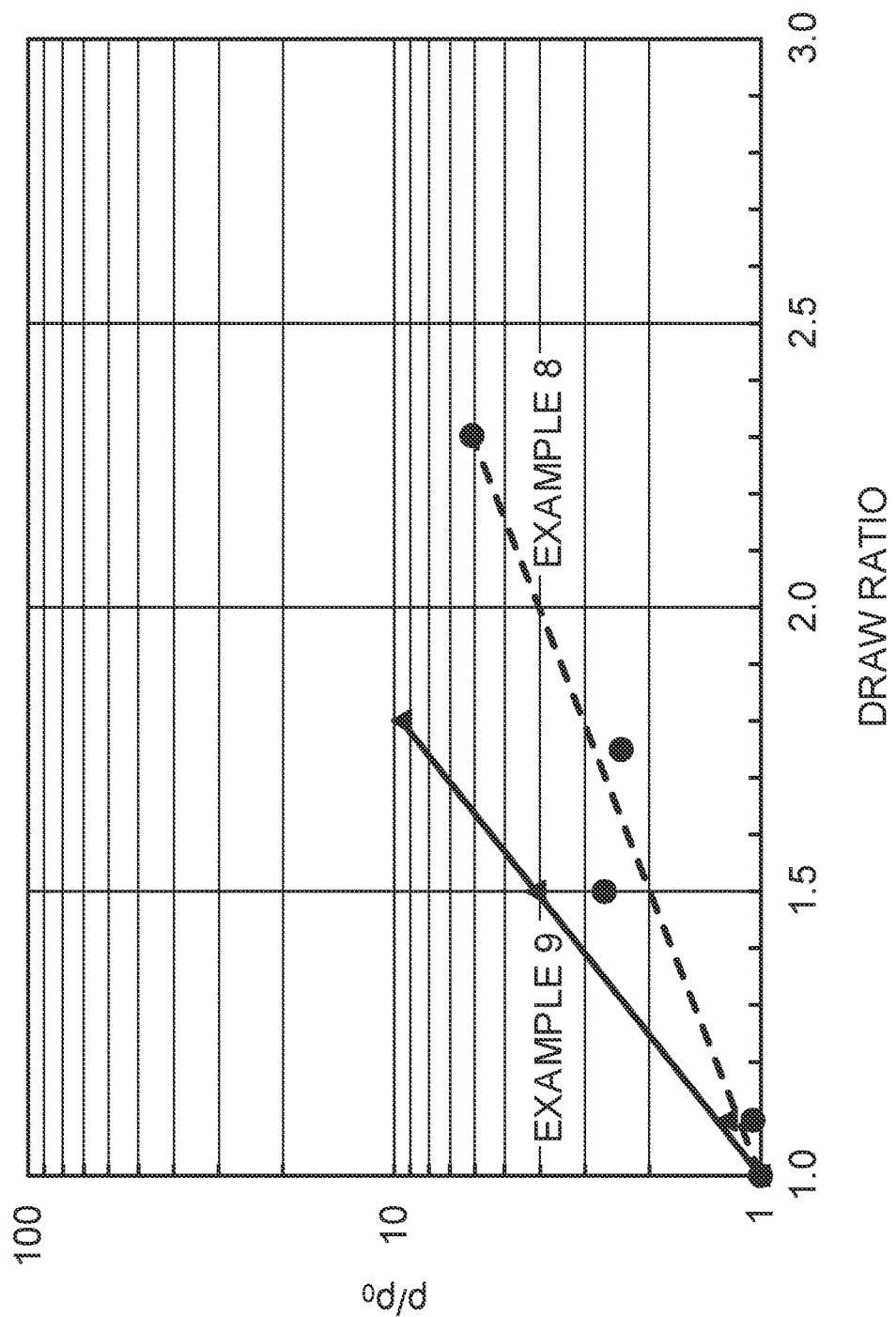
FIG. 1 shows a relationship between $\rho/\rho_0$ and the draw ratio of elastic wiring boards in the present invention for Examples 8 and 9.

Hereinafter, embodiments of the present invention will be described. Unless otherwise specified, the numerical range "A to B" represents A or more and B or less.

A bendable wiring board, an elastic wiring board, and electronic devices provided with the wiring boards according to the present embodiment include: a single layer film of a polyurethane that can be synthesized by allowing a long-chain polyol to react with a polyisocyanate, and wiring formed on the single layer film, in which a temperature of the polyurethane at which a storage elastic modulus measured by a dynamic viscoelasticity measurement becomes 1 MPa is 155° C. or higher, and the polyurethane has the storage elastic modulus of 20 to 200 MPa at 25° C., a tensile strength of 20 to 80 MPa, and elongation at break of 500 to 900%. Polyurethane preferably includes a hard segment consisting of the polyisocyanate and the chain extender, and includes, for example, polyurethane, long-chain polyols (i.e., macropolyols) and chain extension agents obtained by the reaction of the polyisocyanate described above. In particular, it is suitable that the polyisocyanate, i.e., a polymer of an isocyanate compound, has a constituent unit derived from 1,4-bis(isocyanatomethyl)cyclohexane with a trans isomer at a proportion of 70% to 95%, but the present invention is not limited thereto.

The elastic wiring board according to the present embodiment has a ratio $\rho/\rho_0$ in the range of 1.05 to 10.0. The $\rho/\rho_0$ is a ratio between the specific electrical resistance ($\Omega\cdot$cm) $\rho_0$ of wiring and the specific electrical resistance $\rho$ when the wiring of the specific electrical resistance $\rho_0$ is stretched and changed. Any elastic wiring board having the ratio $\rho/\rho_0$ that falls within the above range according to the stretching change may be used in an electrical wiring or as a sensor component without any usage limitations. The usage of the above-described bendable wiring board, the elastic wiring board and electronic devices provided with the wiring boards are not limited, so that they can produce a multi-functional electronic device by combining with a wiring board of a general-purpose hard board or an electronic device.

In this polyurethane, a soft segment is formed by the reaction of the polyisocyanate and the long-chain polyol, and a hard segment is formed by the reaction of the polyisocyanate and the chain extender. Further, the polyurethane is preferably a thermoplastic polyurethane from the viewpoint of ease of film molding and processing.

The polyisocyanate for producing the polyurethane according to the present embodiment contains the isocyanate group of the isocyanate compound with respect to the total number of moles of the isocyanate group in a proportion of more than 50 mol %, preferably 70 mol % or more, more preferably 80 mol % or more, and particularly preferably 90 mol %. The proportion is most preferably 100 mol %.

When the isocyanate compound is 1,4-bis(isocyanatomethyl)cyclohexane, the isocyanate compound contains steric isomers of cis-1,4-bis(isocyanatomethyl)cyclohexane (hereinafter referred to as cis-1,4 isomer) and trans-1,4-bis(isocyanatomethyl)cyclohexane (hereinafter referred to as trans-1,4 isomer). In the present invention, 1,4-bis(isocyanatomethyl)cyclohexane contains the trans-1,4 isomer in an amount of preferably 50% by mass or more, more preferably 70% by mass or more, and particularly preferably 80% by mass or more. The amount is most preferably 95% by mass.

Examples of the isocyanate compound in the polyisocyanate include polymers of 4,4'-diphenylmethane diisocyanate and 4,4'-diphenylmethane diisocyanate (such as carbodiimide modified product, uretonimine modified product and acylurea modified product), and benzene ring-containing polyisocyanates (specifically, benzene ring-containing diisocyanate) such as 2,4'-diphenylmethane diisocyanate, 2,2'-diphenylmethane diisocyanate, 3,3'-dimethylbiphenyl-4,4'-diisocyanate, 3,3'-dimethoxybiphenyl-4,4'-diisocyanate, p-phenylenediisocyanate, 4,4'-diphenyl diisocyanate, 4,4'-diphenyl ether diisocyanate, 2,4-tolylene diisocyanate and 1,4-xylylene diisocyanate. The examples also include alicyclic diisocyanates such as 1,4-bis(isocyanatomethyl)cyclohexane, 1,3-cyclopentanediisocyanate, 1,4-cyclohexanediisocyanate, 1,3-cyclohexanediisocyanate, 3-isocyanatomethyl-3,5,5-trimethylcyclohexylisocyanate, 4,4'-methylenebis (cyclohexylisocyanate), methyl-2,4-cyclohexanediisocyanate, methyl-2,6-cyclohexanediisocyanate, 1,3-bis (isocyanatomethyl) cyclohexane, 1,3-bis (isocyanatoethyl) cyclohexane, 1,4-bis (isocyanatoethyl) cyclohexane, 2,5- or 2,6-bis (isocyanatomethyl) norbornan and mixtures thereof. The examples further include aliphatic diisocyanates such as trimethylene diisocyanate, tetramethylene diisocyanate, pentamethylene diisocyanate, hexamethylene diisocyanate, 1,2-propylene diisocyanate, 1,2-butylene diisocyanate, 2,3-butylene diisocyanate, 1,3-butylene diisocyanate, 2,4,4- or 2,2,4-trimethylhexamethylene diisocyanate and 2,6-diisocyanate methyl caproate.

Preferable examples of the isocyanate compound capable of producing a polyurethane—the polyurethane contains a hard segment, which is formed by the reaction of a polyisocyanate and a chain extender, the polyurethane contains an isocyanate compound in a proportion of more than 50 mol %, and the a temperature of the polyurethane at which a storage elastic modulus measured by a dynamic viscoelasticity measurement becomes 1 MPa is 155° C. or higher—include 4,4'-diphenylmethane diisocyanate and 1,4-bis(isocyanatomethyl)cyclohexane. A particularly preferred example is 1,4-bis(isocyanatomethyl)cyclohexane.

The long-chain polyol is a compound having two or more hydroxyl groups and having a number average molecular weight of 400 or more. Examples of the long-chain polyol include polyether polyols, polyester polyols and polycarbonate polyols. Examples of the polyether polyols include polypropylene glycol, and polytetramethylene ether glycol.

The number average molecular weight of the long-chain polyol (number average molecular weight measured by GPC using standard polyethylene glycol as a calibration curve) is, for example, 400 to 5,000, preferably 500 to 3,500, and more preferably 1,500 to 2,500. The hydroxyl value of the long chain polyol is, for example, 10 to 125 mgKOH/g.

Examples of the polyester polyols include a polycondensate obtained by the reaction of a polyhydric alcohol and a polybasic acid under any known condition.

Examples of the polybasic acid include carbonic acids such as oxalic acid, malonic acid, succinic acid, methylsuccinic acid, glutaric acid, adipic acid, 1,1-dimethyl-1,3-dicarboxypropane, and 3-methyl-3-ethylglutaric acid, azelaic acid, sebacic acid, other aliphatic dicarboxylic acids (having 11 to 13 carbon atoms), suberic acid, undecanedioic acid, dodecanedioic acid, tridecanedioic acid, tetradecanedioic acid, pentadecanedioic acid, octadecanedioic acid, nonadecandioic acid, eicosandioic acid, methylhexanedioic acid, citraconic acid, hydrogenated dimeric acid, maleic acid, fumaric acid, itaconic acid, orthophthalic acid, isophthalic acid, terephthalic acid, toluenedicarboxylic acid, dimeric acid and HET acid, acid anhydrides derived from these carboxylic acids, acid halides, ricinoleic acid, and 12-hydroxystearic acid.

Examples of the polyester polyols also include polycaprolactone polyols and polyvalerolactone polyols obtained by ring-opening polymerization of lactones such as ε-caprolactone and γ-valerolactone using a dihydric alcohol as an initiator, and further, lactone-based polyols obtained by copolymerizing the polycaprolactone polyols and polyvalerolactone polyols with dihydric alcohols.

Examples of the polyester polyols further include castor oil polyol, modified castor oil polyol obtained by the reaction of castor oil polyol and polypropylene glycol.

Examples of the polycarbonate polyols include a ring-opening polymer of ethylene carbonate using a dihydric alcohol as an initiator, and amorphous polycarbonate polyols (liquid form at room temperature) obtained by copolymerizing a dihydric alcohol such as 1,3-propanediol, 1,4-butanediol, 1,5-pentanediol and 1,6 hexanediol with a ring-opening polymer.

These long-chain polyols may be used in individual or in combination. Examples of the long-chain polyols are preferably polytetramethylene ether glycol, polycarbonate polyols, and polyester polyols, and more preferably amorphous polytetramethylene ether glycol (liquid form at room temperature), amorphous polycarbonate diols (liquid form at room temperature), and amorphous polyester polyols (liquid form at room temperature).

In the synthesis of the polyurethane, the above-described low molecular weight polyol may be used in combination with the long-chain polyol.

Examples of the chain extender according to the present embodiment include low molecular weight polyols such as dihydric alcohols and trihydric alcohols, monoamines and diamines such as alicyclic diamines and aliphatic diamines.

Examples of the monoamines include dimethylamine, diethylamine, di-n-propylamine, diisopropylamine, di-n-butylamine, diisobutylamine, di-t-butylamine, dihexylamine, 2-ethylhexylamine, 3-methoxypropylamine, 3-ethoxypropylamine, 3-(2-ethylhexyloxypropylamine), 3-(dodecyloxy) propylamine, and morpholine.

Examples of the alicyclic diamines include 1-amino-3-aminomethyl-3,5,5-trimethylcyclohexane, bis-(4-aminocyclohexyl) methane, diaminocyclohexane, 3,9-bis (3-aminopropyl)-2,4,8,10-tetraoxaspiro[5,5]undecane, 1,3- and 1,4-bis(aminomethyl)cyclohexanes and mixtures thereof, and 1,3- and 1,4-cyclohexanediamines and mixtures thereof.

Examples of the aliphatic diamines include ethylenediamine, propylenediamine, hexamethylenediamine, hydrazine, 1,2-diaminoethane, 1,2-diaminopropane and 1,3-diaminopentane. Chain extension using these chain extenders allows the hard segment in the polyurethane to contain a urea group ($-NH_2-CO-NH_2-$). A thermoplastic polyurethane having excellent bendability, elasticity and extensibility can thus be obtained.

The weight average molecular weight of the polyurethane (weight average molecular weight measured by GPC using standard polystyrene as a calibration curve) is, for example, 60,000 to 300,000, preferably 90,000 to 250,000.

In the polyurethane, the concentration of the hard segment formed by the reaction of the above-described polyisocyanate and the chain extender is preferably 2 to 30% by mass, more preferably 3 to 20% by mass, and particularly preferably 3 to 10% by mass.

The polyurethane substantially does not have a structure derived from a vinyl polymer in its side chain.

When the polyurethane according to the present embodiment is required to have high transparency and no yellowing, the polyurethane may include a modifier such as an antioxidant, a surfactant and/or a plasticizer, a stabilizer such as an ultraviolet absorber and/or an antibacterial agent, and/or an reinforcing agent such as glass fibers and/or inorganic fillers, as necessary.

Requirement of high transparency and no yellowing for the polyurethane according to the present embodiment means that a molded product such as a film and a sheet obtained from a polyurethane by a molding method such as a solution cast method, a heat melting method, a melt extrusion molding method, or an injection molding method has total light transmittance of 80% or more, preferably 83% or more, more preferably 85% or more, and particularly preferably 90% or more.

The film thickness of the polyurethane film according to the present embodiment is preferably 1 to 500 μm, more preferably 1 to 350 μm. In particular, for a bendable wiring board, an elastic wiring board, and a bendable or elastic electronic device equipped with a sensor function, which are attachable to a human body, the feel to the touch of the wiring boards and the electronic device also depends on the thickness of the film, and the thickness of the film is preferably 3 to 250 μm, more preferably 3 to 150 μm. If this thickness exceeds 500 μm, the rigidity of the film increases, which may worsen the feel to the touch. Rigidity and elasticity are contradictory actions and are naturally unsuitable for wiring boards having high rigidity and elasticity. The use of a film having a thickness more than 500 μm and thus having increased rigidity may be difficult to maintain the elasticity without breaking the wiring thereon.

The film composed of the polyurethane according to the present embodiment may be single layered or multi layered.

When a highly rigid film such as a PET film, a PI film, or a PEN film is used in combination with a single-layer film of this polyurethane, the bendable or elastic wiring board of the present invention cannot be obtained. Using the combination film feels harsh to the touch, and thus it is better not to use these combination films in the present embodiment.

For obtaining a molded product in a form of a single-layer film of the polyurethane according to the present embodiment, the film may be produced by, for example, forming a film on a support by a solvent casting method, heat-treating the film at a temperature of 100° C. or higher, cooling the film, and then peeling the film from the support. The film may be peeled off from the support by attaching a commercially available tape to the edge of the film and applying stress to the tape to peel the film off, or by bringing a liquid such as a solvent into contact with the contact interface between the film and the support and peeling the film off by utilizing the difference in surface tension between the surface of the support and the contact surface of the film. Alternatively, laser lift-off may be used.

The film may also be produced by a melt molding method. Examples of the melt molding method for producing a film include a method in which the polyurethane according to the present embodiment exemplified above is formed into a film from a melt kneader through a T-die, a method in which the polyurethane is pressed using a heating plate to form a film, and an inflation method. In the film production by the melt extrusion molding method using a T-die, for example, the polyurethane containing additives as necessary is put into an extruder, melt-kneaded at a temperature higher than the glass transition temperature thereof by preferably 50° C. to 300° C., more preferably 100° C. to 250° C., and then extruded from the T-die to form a molten polymer, and further, the molten polymer may be processed by cooling with a cooling roll to form a film. The heating temperature during the pressing by using a heating plate to form a film is equal to the temperature at the time of the melt-kneading described above.

In the case of obtaining a soft film, films from adhering to each other due to the load between the films can be prevented by forming films (or a film) melt-molded on both sides (or one side) of a releasable film such as PET, cooling the films to 100° C. or lower, and then handling the films as they are still on the releasable film.

The molded product in a form of a film of the polyurethane according to the present embodiment is substantially free of water. This is an important factor for the circuit wiring to maintain stable electrical characteristics without causing migration over time.

The Young's modulus or storage elastic modulus of a single-layer film of the polyurethane according to the present embodiment at room temperature of 25° C. is 20 to 200 MPa, preferably 20 to 150 MPa. In the present embodiment, a firing (or sintering) temperature is preferably 80° C. to 170° C. when circuit wiring is directly drawn by a printing technology that applies a metal particle ink or paste onto a film made of the polyurethane.

In particular, it is preferable for wiring formation that the Young's modulus or storage elastic modulus of the film is maintained at a strength of 1 MPa or more with respect to a maximum temperature of 170° C. Further, it is preferable that the Young's modulus or storage elastic modulus of this film is maintained at a strength of 1 MPa or more with respect to 155° C. or higher.

In the present embodiment, the polyurethane film has a tensile strength of 20 to 80 MPa and elongation at break of 500 to 900%, and thus has sufficient strength and elongation.

The Young's modulus or storage elastic modulus of polyester or polyimide such as PET or PEN, which is generally used as a film or sheet for forming wiring, is 2 to 4 GPa for polyester and 3 to 7 GPa for polyimide at room temperature. Wiring boards and electronic devices produced from such a polyester or polyimide have a certain degree of flexibility, but partly due to their high Young's modulus or storage elastic modulus, only very hard and stiff feeling wiring boards and electronic devices can be provided. The Young's modulus of the surface layer of a human skin is in a range of 25 to 220 kPa (S, MacNeil, Nature, 445,874 (2007)) and the skin recognizes the feel at a Young's modulus or storage modulus higher than the above range. A structure having a Young's modulus or a storage elastic modulus of 1 GPa or more is recognized as being very hard and stiff to the touch.

A single-layer film of the polyurethane according to the present embodiment meanwhile has 200 MPa or less in a Young's modulus or storage elastic modulus at 25° C. of room temperature, 20 to 80 MPa in a tensile strength, 500 to 900% in a elongation at break and 83 to 100A in a hardness (asker). Thus, the single-layer film of the polyurethane is non-sticky and has flexibility and elasticity. A bendable or elastic wiring board made of a film having these physical property values, and a bendable or elastic electronic device having a sensor function and a short-range wireless communication function on this wiring board has a board whose backside in contact with a human body has also a good contact feeling for the human body.

Further, this hardness correlates with Young's modulus or storage elastic modulus of a single-layer film of the polyurethane. For example, when the hardness is 80A, the temperature at which the storage viscoelasticity obtained by dynamic viscoelasticity measurement becomes 1 MPa or more is about 150° C. or lower, and the tensile strength is 20 MPa or less, and thus the heat resistance deteriorates sharply. Such a polyurethane single-layer film cannot withstand the temperature of firing after circuit wiring is drawn by a printing technology with the use of a metal particle ink or paste applied onto the polyurethane film, thereby causing wiring deformation or disconnection. A failure of circuit caused by the deformation of this polyurethane film itself because the film cannot withstand the flow temperature or reflow temperature when connection wiring and electronic components are mounted as described below, and a failure on process is also caused from a fusion of the film upon a support. Such a polyurethane film thus cannot manufacture a bendable or elastic wiring board, or a bendable or elastic electronic device.

In the present embodiment, on the other hand, circuit wiring can be formed by directly drawing the wiring by a coating and printing technology with the use of a metal particle ink or paste firing the wiring, and thus highly conductive metal nanoparticles, nanoflakes or nanotubes can be used. Examples of this metal for use include particles of metals such as gold, silver, copper, nickel, zinc, aluminum, calcium, magnesium, iron, platinum, palladium, tin, chromium and lead, alloys of these metals such as silver/palladium, thermally decomposable metal compounds which thermally decompose at a relatively low temperature to give a conductive metal such as silver oxide, organic silver, organic gold, and conductive metal oxide particles such as zinc oxide (ZnO) and indium tin oxide (ITO). Metals such as gold, silver and copper are preferably used, and in particular, silver that is stable in the atmosphere, little changes over time and economically comparable is preferably used.

Any known metal particle inks or pastes can be used here. The average particle size of the metal particles is, for example, in the range of 5 to 500 nm.

The viscosity of the metal particle ink or paste at 25° C. of room temperature is, for example, in the range of 1 to 500 mPa·s. The viscosity can be adjusted by using a solvent. Examples of the solvent include alcohols such as methanol, ethanol and butanol, ethers such as tetrahydrofuran, diethyl ether, dibutyl ether, dimethoxyethane and dioxane, aromatics hydrocarbons such as benzene, toluene, xylene and ethylbenzene, aliphatic hydrocarbons such as, pentane, hexane and heptane, aliphatic cyclic hydrocarbons such as cyclopentane, cyclohexane, methylcyclohexane, dimethylcyclohexane and decalin, halogenated hydrocarbons such as methylenedichloride, dichloroethane, dichloroethylene, tetrachloroethane, chlorobenzene and trichlorobenzene, and esters such as methyl acetate and ethyl acetate, although the examples are not particularly limited thereto. The solvents may be used in individual or in combination. Into the solvent, a leveling agent may be added and used in combination, or a polymer compound may be added to complement the functions of the above-described metal particle ink or paste. For example, an acrylic resin, an epoxy resin, any type of elastomer and/or the like may be mixed in order to impart adhesiveness or adjust elasticity, although such addition is not particularly limited. When the viscosity of the metal particle ink or paste is within the above range, the printing method for applying can be appropriately selected, and the metal particle ink or paste may be drawn by printing after designing the wiring width and wiring height in consideration of electrical characteristics.

The wiring width and the wiring height formed by firing after printing according to the present embodiment are not particularly limited, but usually the wiring is formed to have a width in the range of 0.5 µm to 10 cm, preferably 1 µm to 10 mm, and the height in the range of 100 nm to 1,000 µm, preferably 500 nm to 100 µm.

Examples of the printing method for applying the above metal particle ink or paste on the above polyurethane film include screen printing, gravure offset printing, soft blanket gravure-offset printing, flexo printing, letterpress reversal printing, inkjet printing, and a spin coat coating method.

The above printing method allows the metal particle ink or paste to be applied directly onto a single-layer film of the polyurethane described above, thereby drawing the circuit wiring. Subsequently, a bendable wiring board or elastic wiring board in which wiring is formed can be produced by firing. The film may be fired in the air, or in an inert gas such as nitrogen gas or a rare gas. At that time, printing may be performed on the film, and then the film may be fired after fixed in advance with heat-resistant tape on a hard and smooth surface table or plate made of, for example, like glass, stainless steel, or plastics such as PET by vacuum suction or heat-adhesion on the table or plate.

This temperature over firing is 80° C. to 170° C. as described above, and a uniform and strong fusionning adhesion interface can be formed at the interface between the fired molten metal film and the surface of the polyurethane single-layer film. The adhesion between this metal molten film and the surface of the polyurethane film can be achieved by the high Young's modulus or storage elastic modulus of the film and hardness due to the heat over firing, and secured also by a urethane bond of the film. For firing the metal particles applied by printing, a light firing method using a xenon flash lamp, a heating firing method using an infrared heater in an oven or on a plate or the like can be used. Furthermore, the use of the polyurethane allows heating to be performed without setting up on a stretching and shrinking prevention guide during the firing.

Before applying the metal particle ink or paste directly on the film, the surface energy (surface free energy) of a single-layer film of the polyurethane is preferably 15 mN/m or more. As a structural feature of the polymer, the film can be said to have a surface energy in the above range. The upper limit of the surface energy is not particularly limited, and is, for example, 80 mN/m.

For the reasons described above, the adhesion between the molten metal wiring and the surface layer of the polyurethane film can be exhibited, and the bendable or elastic function of the wiring board or the electronic device can be achieved.

Application by printing the metal particle ink or paste directly on the above polyurethane single-layer film by printing can draw wiring circuit in the present embodiment. Then, the circuit wiring is formed by firing. The wiring of the bendable or elastic wiring board may be multi-layer wiring. During the forming of the wiring, an insulating film can be formed between the upper wiring and lower wiring, and a through hole can be provided at the same time.

Examples of materials of the insulating film for use include organic insulating materials such as polymethylmethacrylate, polystyrene, polyvinylphenol, polyimide, polycarbonate, polyester, polyvinyl alcohol, polyvinylacetate, polyurethane, polysulfone, polybenzoxazole, polysilsesquioxane, epoxy resins, and phenolic resins. A cross-linking agent (for example, melamine) may be used in combination to improve the durability of bendable or elastic properties.

The method for forming this insulating film is not particularly limited, and for example, a method for forming a film by applying an insulating film forming composition that contains an organic insulating material can be used. Examples of the method include spray coating method, spin coating method, blade coating method, dip coating method, casting method, roll coating method, bar coating method, die coating method, screen printing that performs application while forming a pattern, gravure offset printing, soft blanket gravure offset printing, flexo printing, letterpress reversal printing, and inkjet printing.

The composition for forming an insulating film may contain a solvent as necessary. The composition for forming an insulating film may also contain a cross-linking component. For example, a crosslinked structure can be introduced into the insulating film by adding a crosslinked component such as melamine to an organic insulating material containing a hydroxy group. For an organic insulating material having a functional group such as an alkyl silicon group or an alkoxy silicon group, a curing agent or a reaction initiator can be mixed into the material to introduce a crosslinked structure into the insulating film. At that time, the coating film may be heated and fired, and also, it is preferable that the heating process also removes the solvent and the volatile components for maintaining the insulating properties and keeping the electrical resistance of the metal wiring formed on and under the film low. The heating temperature is preferably 200° C. or lower, particularly 80 to 200° C., and more preferably 100 to 170° C.

The type and combination of organic solvents that may be contained in the composition for forming an insulating film are not particularly limited, and examples thereof include toluene, xylene, mesitylene, decahydronaphthalene, N-methyl-2-pyrrolidone, anisole, γ-butyrolactone, chlorobenzene, dichlorobenzene, trichlorobenzene, tetralin, 1-methylnaphthylene, 1,4-diisopropylbenzene, diethylene glycol monobutyl ether, propylene glycol 1-monomethyl ether 2-acetate, butyl acetate, ethanol and butanol.

Although the thickness is not particularly limited, the film thickness of the insulating film to be formed is preferably 50 nm to 10 µm, more preferably 200 nm to 5 µm. The thickness in the above range does not affect the bendable or elastic performance.

At the time when forming of multi-layer wiring, the surface of a wiring board may have poor wettability relative to the coating liquid of the composition for forming an insulating film, and in such a case, the wettability may be improved by performing surface treatment on the wiring board such as plasma treatment using oxygen, nitrogen, argon or the like as a reactive gas, ultraviolet irradiation treatment, and ultraviolet ozone treatment.

A conductive organic compound may be used in combination with the metal particle ink or paste, for example, polyethylene dioxythiophene/polystyrene sulfonic acid (PEDOT/PSS), poly(3-hexylthiophene-2,5-diyl)/[6,6] phenyl C61 butyrate methyl ester (P3HT/PCBM) or polyaniline may be used in the present embodiment. A carbon-based conductive material such as carbon nanotubes or graphenes may also be used. The above conductive organic compound or the carbon-based conductive may be mixed into the metal particle ink or paste to complement the functions of the present embodiment.

The term "bendable" of the bendable wiring or bendable electronic devices in the present invention does not refer to the fatigue strength when repeatedly folding and bending operations such as the reference standards JIS C5016 and ASTM D2176 are applied. The term "bendable" means that the change in electrical resistance with respect to the minimum bending radius does not exceed a predetermined threshold value so that the function as circuit wiring can be maintained. The relationship between the bending radius and the change in electrical resistance depends on the wiring width and wiring height, and the wiring is formed by firing to have a width in the range of 0.5 µm to 10 cm, preferably 1 µm to 10 mm, and the height in the range of 100 nm to 1,000 µm, preferably 500 nm to 100 µm. A bendable wiring board when the bending radius is 3 to 0.25 mm in the present invention is a wiring board whose absolute value of the threshold is in a range of 0 to 30% for the change in electrical resistance obtained by dividing the value of the difference between the electrical resistance value when the wiring board is bent at 180° and the resistance value before the bending by the resistance value before the bending. This range is preferably 0 to 20%, more preferably 0 to 15%.

The glass transition temperature (which is from tan δ peak temperature measured by dynamic viscoelasticity measurement) of the polyurethane to be used for this bendable wiring board is preferably −48° C. to 10° C., more preferably −45° C. to 5°, and still more preferably −45° C. to 0° C.

Furthermore, the elastic wiring board having the features below can provide a highly flexible and elastic electronic device which has a suitable texture and can follow the movement of a human body. That is, the elastic wiring board includes wiring formed on a polyurethane film by directly drawing circuit wiring by a coating and printing technology with the use of metal particle ink or paste, which forms elastic wiring after firing, and firing the wiring, and the elastic wiring board has the ratio $\rho/\rho 0$ of the specific electrical resistance ($\Omega \cdot cm$) $\rho 0$ to the specific electrical resistance $\rho$ when the wiring of the specific electrical resistance $\rho 0$ is stretched and changed varies in the range of 1.05 to 10.00. In addition, a temperature of the polyurethane at which a storage elastic modulus measured by a dynamic viscoelasticity measurement becomes 1 MPa is 155° C. or higher, and the polyurethane has the storage elastic modulus of 20 to 200 MPa at 25° C., having a tensile strength of the polyurethane of 20 to 40 MPa, and having elongation at break between 500 to 900%.

The glass transition temperature (which is from tan δ peak temperature measured by dynamic viscoelasticity measurement) of the polyurethane to be used for this elastic wiring board is preferably −48° C. to 20° C., more preferably −45° C. to −25° C. The glass transition temperature does not represent the practical temperature, and the practical temperature is dominated by the temperature at which the storage elastic modulus becomes 1 MPa measured by the dynamic viscoelasticity measurement.

The elastic wiring composed of the metal particle ink or paste that forms elastic wiring after firing in the present embodiment is formed by directly drawing circuit wiring by the above-described coating and printing technology, and firing the circuit wiring. A mixture of highly conductive metal nanoparticles, nanoflakes, or nanotubes and a resin having rubber elasticity for imparting elasticity, such as an acrylic resin, an epoxy resin or various elastomers, may be preferably used.

A metal particle ink composition or paste composition can be used to form this elastic wiring, and the viscosity of the composition can be appropriately adjusted with a solvent. Examples of the solvent include alcohols such as methanol, ethanol and butanol, ethers such as tetrahydrofuran, diethyl ether, dibutyl ether, dimethoxyethane and dioxane, aromatics hydrocarbons such as benzene, toluene, xylene and ethylbenzene, aliphatic hydrocarbons such as, pentane, hexane and heptane, aliphatic cyclic hydrocarbons such as cyclopentane, cyclohexane, methylcyclohexane, dimethylcyclohexane and decalin, halogenated hydrocarbons such as methylenedichloride, dichloroethane, dichloroethylene, tetrachloroethane, chlorobenzene and trichlorobenzene, and esters such as methyl acetate and ethyl acetate, although the examples are not particularly limited thereto. The solvents may be used in individual use or in combination.

Examples of the conductive metal capable of forming the elastic wiring in the present embodiment include particles of metals such as gold, silver, copper, nickel, zinc, aluminum, calcium, magnesium, iron, platinum, palladium, tin, chromium and lead, alloys of these metals such as silver/palladium, thermally decomposable metal compounds which thermally decompose at a relatively low temperature to give a conductive metal such as silver oxide, organic silver, organic gold, and conductive metal oxide particles such as zinc oxide (ZnO) and indium tin oxide (ITO). Metals such as gold, silver and copper are preferably used, and in particular, silver that is stable in the atmosphere, little changes over time and economically comparable is preferably used.

After forming the elastic wiring in the present embodiment, the elastic wiring board can be stretched or restored. The elastic wiring board whose specific electrical resistance ratio can be expressed as a function of a draw ratio by extending (stretching) the board to a certain length can be produced. From microscopic observation and the like, it became apparent in the present invention that the change is not due to the occurrence of a partial breakage or shape change of the wiring, although the electrical characteristics of the elastic wiring itself is changed from the stress at the interface between the wiring and the board and also inside the wiring due to the stretching change, thus increasing the resistance value.

With the ratio $\rho/\rho 0$ in the range of 1.05 to 10.0, in which $\rho/\rho 0$ being the ratio between the specific electrical resistance ($\Omega \cdot cm$) $\rho 0$ before the stretching and the specific electrical resistance $\rho$ when the wiring is changed by stretching, it becomes apparent in the present invention that the ratio is a function of the draw ratio while depending on the tensile strength of the polyurethane film and its isocyanate skeleton, and the correlation coefficient of the ratio is in an approximate relationship at 0.90 or more. Under this range of specific electrical resistance ratio, the draw ratio is at magnifications of 1.1 to 2.9, and depends on the tensile strength of the polyurethane, the polyisocyanate skeleton and the stretching ratio, then an elastic wiring board may be provided with elastic wiring can be obtained.

Needless to say that this wiring is also bendable wiring as well as in the above description, when the bending radius is a state in the range of 3 to 0.25 mm, the bendable wiring board in the embodiment is wiring board whose absolute value of the threshold is in a range of 0 to 30%. That is a change in electrical resistance obtained by dividing the value of the difference between the electrical resistance value obtained when the wiring board is bent at 180° and the resistance value before the bending by the resistance value before the bending. This range is preferably 0 to 20%, and more preferably 0 to 15%.

The specific electrical resistance value $\rho_0$ according to the present embodiment can be applied in the range of $10^{-6}$ to $10^{-4}$ $\Omega \cdot cm$. With $\rho/\rho 0$ in the range of 1.05 to 10.0, the voltage or current can be controlled to be constant by using a control component such as an amplifier. For example, when $\rho 0$ is $10^{-4}$ $\Omega \cdot cm$ of the maximum value and $\rho/\rho 0$ is 10.0 times of the maximum value, the specific electrical resistance value drops to $10^{-6}$ Ω·cm, and the electronic circuit can be driven normally by controlling the maximum amplification value to 100 times.

The wiring width of the elastic wiring in the present embodiment is not particularly limited, and it may be formed to have a wiring width in the range of, as example, 0.5 µm to 10 cm, preferably 1 µm to 10 mm. and also a wiring height may be formed in the range of 100 nm to 1,000 µm, preferably, 500 nm to 100 µm.

The bendable or elastic electronic device in the present embodiment may be provided with a sensor function, for example, by providing a sensor capable of measuring a predetermined physical quantity. The above sensor function may be a function that temporarily replaces the physical quantity of information from a sensor with an electric signal to be processed by an electronic circuit, and further converts the electric signal to the physical quantity that can be read by humans. The signal acquired by the electric circuit from the sensor needs to be converted by using an AD converter that replaces an analog signal with a digital signal so that the measurement result can be read by humans with the use of software. Examples of specific physical quantities include acceleration, force including pressure, vibration, heat, light, electricity, and chemistry and biochemistry values.

In addition, in order to read the measurement results obtained by software, the device that may transmit information to digital terminals such as smartphones, smart watches, and tablet terminals, have widely used communication functions in recent years provided with a kind of wireless communication devices, particularly wireless communication devices with short-range wireless communication functions, which transmit information to digital. The use of USB cable or jack cable transmission naturally poses no problem, and there is no limitation in using in combination with the above devices.

The bendable or elastic electronic device refers to an electronic circuit formed on a wiring board whose absolute value of the threshold is 0 to 30% for change in electrical resistance obtained by dividing the value of the difference between the electrical resistance value when the wiring board is bent at 180° and the resistance value before the bending by the resistance value before the bending. The elastic electronic device refers to an electronic device formed on an elastic wiring board with the above-described $\rho/\rho_0$ in the range of 1.05 to 10.0.

Among the above-described physical quantities, it is found that a temperature sensor relating to heat can be particularly preferably applied in the present embodiment. The temperature measurement may be a contact type or a non-contact type, and for the portion on the electronic device, a conductive organic compound having a temperature measurement coefficient in which the electric resistance changes depending on the temperature can be used. For example, polyethylene dioxythiophene/polystyrene sulfonic acid (PEDOT/PSS), poly(3-hexylthiophene-2,5-diyl)/[6,6]phenyl C61 butyrate methyl ester (P3HT/PCBM) or polyaniline can be used. Carbon-based conductive materials such as carbon nanotubes and graphene may also be used. A conductive inorganic substance, metal or metal oxide may also be used.

Installing this temperature sensor enables to obtain various information such as human body temperature information, distribution environment information, or product quality environment information by transmitting information to a digital terminal by a short-range wireless communication function.

These communication functions may use wireless communication called near field communication (NFC) which uses a frequency of 13.56 MHz that can be used for wireless power supply, and uses wireless communication with international standards such as ISO/IEC 14443, 18092, 15693, and 21481, and thus so-called passive electronic devices can be made. Further, for an IC tag having these communication functions, an information function as an RFID may mounted. It may be an active electronic device equipped with a battery. In addition, although the installation of a primary battery and a secondary battery and a wiring power supply would be needed, Bluetooth as basic-rate/enhanced-data-rate and low energy (to 5 m) that can be available in 2.4 GHz frequency can be used, and UHF and ZigBee in 2.4 GHz frequency band, 900 MHz band (for example, 920 MHz (to 100 m)) and 800 MHz band can be used.

Transmitting and receiving antenna for information communication may be formed on the bendable or elastic wiring board of the present embodiment by coating and printing technology to provide the above-described information communication function, thereby providing a bendable or elastic electronic device capable of using the information communication function.

To provide bendable or elastic electronic devices economically and inexpensively, the wiring board may be provided with a device which utilizes various existing inexpensive integrated circuits (ICs) and resistors for controlling voltage in order to temporarily replace the physical quantity of information from a sensor with an electric signal to be processed by an electronic circuit, and further convert the electric signal to the physical quantity that can be read by humans. In such a device, the signal acquired by the electric circuit from the sensor is converted by using an AD converter that replaces from an analog signal to a digital signal so that humans can read the measurement result with the use of software.

In the present embodiment, mounted components, connection wiring and an electronic component are required to be installed in an economically inexpensive and durable manner on the above-described wiring board. Which is CMOS used for rectification and signal conversion and an integrated circuit (IC) of AD conversion circuit and flip-flop circuit, a resistor, an amplifier, a light emitter of a laser, organic EL, LED and the like, and is a communication device of NFC, Bluetooth, UHF, ZigBee and the like. In a mounting method, solder is a material that is generally used at low cost, also a low-temperature curing type flexible conductive adhesive can be used, which is a material that has the potential to be economical in the future, although it is expensive at the present stage.

The soldering method may be performed manually by soldering the thread using a soldering iron, but the flow method or the reflow method is an industrially commonly used method. Although any method may be used in the present embodiment, industrially preferred implementation of the electronic components and connection wiring is a method in which solder paste is printed by squeegee printing on the printed circuit board by using a screen such as a stainless steel metal mask having holes in the parts where electronic components are to be mounted, components are placed on the printed solder paste, and then heat is applied to melt the solder. After the electronic components and connection wiring are mounted, the bendable wiring board formed in the present embodiment and the mounted electronic component and the like may be preheated in a reflow furnace to avoid sudden heat shock to the components, and flux activation, solvent vaporization and the like may be performed. The temperature of the preheat in the present embodiment is in the range of 100 to 150° C., and this heating may be performed at 140 to 180° C. in a short heating time. Further, the cooling may be natural cooling, but rapid cooling may also be performed to avoid thermal stress of the electronic components or to prevent solder shrinkage and cracks. Further, in place of the printing, a ball solder may be attached to the IC, placed on a mounting portion, and reflowed.

EXAMPLES

Hereinafter, the present invention will be specifically described with reference to Examples, but the present invention is not limited thereto.

In Examples and Comparative Examples, the storage elastic modulus was measured under the following conditions.

Measuring temperature: −100° C. to 200° C.
Heating rate: 5° C./min
Measuring frequency: 10 Hz Example 1

On a single-layer film of a polyurethane (manufactured by Mitsui Chemicals, Inc.) having the features below and with a film thickness of 100 μm and a 3×15 cm square, seven wires disposed in parallel (space between wires was 500 μm) and mesh electrodes connected to both ends of the wires were printed by a gravure offset printing method using a soft blanket gravure offset printing machine, (which was designed and developed by Tokito Laboratory, Research Center for Organic Electronics, Yamagata University). The wires each have a width of 500 μm and a length of 6.8 cm. The polyurethane was formed by the reaction between a polyisocyanate of 95% trans isomeric 1,4-bis(isocyanatomethyl)cyclohexane and a long-chain polyol, and has the following features: a hardness (asker) of 95A, a glass transition temperature (which was from tan δ peak temperature by dynamic viscoelasticity measurement) of −20° C., a storage elastic modulus by the dynamic viscoelasticity measurement of 80 MPa at 25° C., 190° C. at which the storage elastic modulus becomes 1 MPa, tensile strength of 66 MPa, and breaking elongation of 680%. Specifically, silver paste Dotite XA3609 (manufactured by Fujikura Kasei Co., Ltd.) was applied on a recessed plate with a depth of 30 μm by using a doctor blade, where the silver paste on the recessed plate which is suction-fixed on a stainless steel table by a vacuum pump is received on a soft blanket made of polydimethylsiloxane (PDMS) by rotational crimping, and the received silver paste was transferred by rotational crimping onto the above-described polyurethane single-layer film at a moving speed of 30 mm/sec which was suction-fixed to another stainless steel table, and thus the wiring was printed. This film was fired at 130° C. for 30 minutes and then make a wiring board. The height of the wiring was 4 μm, and the resistance value was 13.5Ω (specific electrical resistance value was $4.0\times10^{-6}$ Ω·cm). Solder paste LT142 (manufactured by Senju Metal Industry Co., Ltd.) was applied to the mesh electrodes at the both ends in the wiring, a lead wires with a clip having an ignorable resistance value were mounted, and then the wiring was preheated at 130° C. for 10 minutes, reflowed at 170° C. for two minutes and slow-cooled to make a wiring board.

Subsequently, the lead wires were connected to a 2-needle resistance measuring meter, and the wiring board was bent at 90° and 180° with a cylindrical rod having a radius of 0.5 mm, and the resistance values for each angles were measured. Each resistance values were 13.8Ω and 13.6Ω, which were 30% or less of the electrical resistance before the bending. Therefore, the wiring board was thus proven to be bendable. Furthermore, even after 120 days, there was no migration in the atmosphere at room temperature, and no change in the resistance value was observed.

Five subjects who had the produced wiring board attached to the back of hands, arms, necks and the like saw how the wiring board felt during the wearing. The five subjects confirmed that the wiring board was flexible, non-sticky, and comfortable to the touch.

Example 2

In place of the polyurethane single-layer film having a hardness of 95A used in Example 1, a single-layer film of a polyurethane (manufactured by Mitsui Chemicals, Inc.) was used with a film thickness of 100 μm and a 3×15 cm square having the features below. On the single-layer film, seven wires disposed in parallel (space between wires was 500 μm) and mesh electrodes connected to both ends of the wires were printed by the soft blanket gravure offset printing method as in Example 1. The wires each have a width of 500 μm and a length of 6.8 cm. The polyurethane was formed by the reaction between a polyisocyanate of 95% trans isomeric 1,4-bis(isocyanatomethyl)cyclohexane and a long-chain polyol, and has the following features: a hardness (asker) of 86A, a glass transition temperature (which was from tan δ peak temperature by dynamic viscoelasticity measurement) of −45° C., a storage elastic modulus by the dynamic viscoelasticity measurement of 20 MPa at 25° C., and a temperature of which the storage elastic modulus reaches to 1 MPa was at 156° C., tensile strength of 33 MPa, and breaking elongation of 820%. This film was fired at 130° C. for 30 minutes, and a wiring board to which lead wires with a clip connected by the same method as in Example 1 was produced.

The height of the wiring was 4 μm, and the resistance value was 17.2Ω (specific electrical resistance was $5.1\times10^{-6}$ Ω·cm). The wiring board was bent at 90° and 180° with the cylindrical rod having a radius of 0.5 mm, and the resistance values for each angles were measured in the same manner as in Example 1. And each resistance values were 17.6Ω and 16.8Ω, which were 30% or less of the electrical resistance before the bending. Therefore, the wiring board was thus proven to be bendable. Furthermore, even after 120 days, there was no migration in the atmosphere at room temperature, and no change in the resistance value was observed.

Five subjects who had the produced wiring board attached to the back of hands, arms, necks and the like saw how the wiring board felt during the wearing. The five subjects confirmed that the wiring board was flexible, non-sticky, and comfortable to the touch.

Example 3

In place of the polyurethane single-layer film used in Example 2, a single-layer film of a polyurethane was used with a film thickness of 100 μm and a 3×15 cm square having the features below. On the single-layer film, seven wires disposed in parallel (space between wires was 500 μm) and mesh electrodes connected to both ends of the wires were printed by the soft blanket gravure offset printing method as in Example 1. The wires each have a width of 500 μm and a length of 6.8 cm. The polyurethane was formed by the reaction of a polyisocyanate composed of 4,4'-diphenylmethane diisocyanate and a long-chain polyol, and has the following features: a hardness (asker) of 95A, a glass transition temperature (which was from tan δ peak temperature by dynamic viscoelasticity measurement) of 5° C., a storage elastic modulus by the dynamic viscoelasticity measurement of 131 MPa at 25° C., and a temperature of which the storage elastic modulus reaches to 1 MPa was at 170° C., tensile strength of 68 MPa, and breaking elongation of 500%. This film was fired at 130° C. for 30 minutes, and a wiring board to which lead wires with a clip were connected was produced by the same method as in Example 1.

The height of the wiring was 4 μm, and the resistance value was 14.5Ω (specific electrical resistance was $4.3 \times 10^{-6}$ Ω·cm). The wiring board was bent at 90° and 180° with the cylindrical rod having a radius of 0.5 mm, and the resistance values for each angles were measured in the same manner as in Example 1. Each resistance values were 14.0Ω and 14.3Ω, which were 30% or less of the electrical resistance before the bending. Therefore, the wiring board was thus proven to be bendable. Furthermore, even after 120 days, there was no migration in the atmosphere at room temperature, and no change in resistance was observed.

Five subjects who had the produced wiring board attached to the back of hands, arms, necks and the like saw how the wiring board felt during the wearing. The five subjects confirmed that the wiring board was flexible, non-sticky, and although the wiring board felt a little uncomfortable to the touch, there is no problem in practical use.

Example 4

In place of the polyurethane single-layer film having a hardness of 95A used in Example 3, a single-layer film of a polyurethane was used with a film thickness of 100 μm and a 3×15 cm square having the features below. On the single-layer film, seven wires disposed in parallel (space between wires was 500 μm) and mesh electrodes connected to both ends of the wires were printed by the soft blanket gravure offset printing method as in Example 1. The wires each have a width of 500 μm and a length of 6.8 cm. The polyurethane was formed by the reaction of a polyisocyanate composed of 4,4'-diphenylmethane diisocyanate and a long-chain polyol, and has the following features: a hardness (asker) of 87A, a glass transition temperature (which was from tan δ peak temperature by dynamic viscoelasticity measurement) of −25° C., a storage elastic modulus by the dynamic viscoelasticity measurement of 27 MPa at 25° C., and a temperature of which the storage elastic modulus reaches to 1 MPa was at 166° C., tensile strength of 36 MPa, and breaking elongation of 520%. This film was fired at 130° C. for 30 minutes, and a wiring board to which lead wires with a clip were connected was produced by the same method as in Example 1.

The height of the wiring was 5 μm, and the resistance value was 16.8Ω (specific electrical resistance was $6.2 \times 10^{-6}$ Ω·cm). The wiring board was bent at 90° and 180° with the cylindrical rod having a radius of 0.5 mm, and the resistance values for each angles were measured in the same manner as in Example 1. Each resistance values were 16.0Ω and 16.3Ω, which were 30% or less of the electrical resistance before the bending. Therefore, the wiring board was thus proven to be bendable. Furthermore, even after 120 days, there was no migration in the atmosphere at room temperature, and no change in resistance was observed.

Five subjects who had the produced wiring board attached to the back of hands, arms, necks and the like saw how the wiring board felt during the wearing. The five subjects confirmed that the wiring board was flexible, non-sticky, and comfortable to the touch.

Example 5

In place of silver paste Dotite XA3609 used in Example 1, silver paste NPS-L-MC1 (manufactured by Harima Chemicals Group, Inc.) having a viscosity of 200 mPa·s was used. A film the same as in Example 1 was placed and fixed on a glass support substrate, and a wire having a width of 100 μm and a length of 8.0 cm with electrodes connected to its both ends was printed by a dispenser printing method (manufactured by Musashi Engineering, Inc.). This film was fired at 130° C. for 60 minutes, and a wiring board to which lead wires with a clip were connected was produced by the same method as in Example 1.

The height of the wiring was 10 μm and the resistance value was 44Ω (specific electrical resistance value was $5.5 \times 10^{-6}$ Ω·cm). The wiring board was bent at 90° and 180° with the cylindrical rod having a radius of 0.5 mm, and the resistance values for each angles were measured in the same manner as in Example 1. Each resistance values were 44Ω and 44Ω, which were 30% or less of the electrical resistance before the bending. Therefore, the wiring board was thus proven to be bendable. Furthermore, even after 120 days, there was no migration in the atmosphere at room temperature, and no change in resistance was observed.

Five subjects who had the produced wiring board attached to the back of hands, arms, necks and the like saw how the wiring board felt during the wearing. The five subjects confirmed that the wiring board was flexible, non-sticky, and comfortable to the touch.

Example 6

In place of silver paste Dotite XA3609 used in Example 1, copper paste CP-1P (manufactured by NOF CORPORATION) having a viscosity of 70 Pa·s was used. A film, having a hardness of 95A, as the same as in Example 1 was placed and fixed on a glass support substrate with heat-resistant tape, and a wire having a width of 250 μm and a length of 14.2 cm, which was bent 5 lines in parallel with a space interval of 400 μm, and with electrodes connected to its both ends was printed on the film by a screen printing method using a screen printer (manufactured by Microtech Co., Ltd.). This film was pre-fired at 90° C. for 2 minutes and then fired at 150° C. for 15 minutes, and a wiring board to which lead wires with a clip were connected was produced by the same method as in Example 1.

The height of the wiring was 6 μm, and the resistance value was 26.7Ω (specific electrical resistance value was $1.1 \times 10^{-6}$ Ω·cm). The wiring board was bent at 90° and 180° with the cylindrical rod having a radius of 0.5 mm, and the resistance values for each angles were measured in the same manner as in Example 1. Each resistance values were 28Ω and 29.4Ω, which were 30% or less of the electrical resistance before the bending. Therefore, the wiring board was thus proven to be bendable. Further, even after 10 days, there was no migration in the atmosphere at room temperature, and no change in the resistance value was observed, but after that, the resistance value tended to gradually increase, and after 30 days, the resistance value increased to 800 kΩ. The wiring board, however, showed the lowest specific electrical resistance value immediately after the wiring was formed.

Comparative Example 1

On a single-layer film of a polyurethane having the features below and with a film thickness of 100 μm and a 3×15 cm square, wires were printed in the same manner as in Example 1. The polyurethane was formed by the reaction between a polyisocyanate of 95% trans isomeric 1,4-bis (isocyanatomethyl)cyclohexane and a long-chain polyol, and has the following features: a hardness (asker) of 80A, a glass transition temperature (which was from tan δ peak temperature by dynamic viscoelasticity measurement) of −58° C., a storage elastic modulus by the dynamic viscoelasticity measurement of 19 MPa at 25° C., and a temperature of which the storage elastic modulus reaches to 1 MPa was at 155° C., tensile strength of 15 MPa, and breaking elongation of 1,000%. When this film was heated at 130° C. for 30 minutes, the film was greatly deformed and the wiring board could not be produced.

Five subjects who had the deformed film attached to the back of hands, arms, necks and the like saw how the film felt during the wearing. The five subjects confirmed that the film was extremely sticky and uncomfortable.

Comparative Example 2

On a single-layer film of a polyurethane having the features below and with a film thickness of 100 μm and a 3×15 cm square, wires were printed in the same manner as in Example 3. The polyurethane was formed by the reaction of a polyisocyanate composed of 4,4'-diphenylmethane diisocyanate and a long-chain polyol, and has the following features: a hardness (asker) of 80A, a glass transition temperature (which was from tan δ peak temperature) of −49° C., a storage elastic modulus by the dynamic viscoelasticity measurement of 25 MPa at 25° C., and a temperature of which the storage elastic modulus reaches to 1 MPa was at 157° C., tensile strength of 16 MPa, and breaking elongation of 600%. When this film was heated at 130° C. for 30 minutes, the film was greatly deformed and the wiring board could not be produced as in Comparative example 1.

Five subjects who had the deformed film attached to the back of hands, arms, necks and the like saw how the film felt during the wearing. The five subjects confirmed that the film was extremely sticky and uncomfortable.

Comparative Example 3

Wiring the same as in Example 1 was printed on a film of a polyethylene terephthalate (PET) (manufactured by Teijin DuPont Films Japan Limited) having a film thickness of 50 μm, a tensile strength of 270 MPa as a representative value in the catalog, and a breaking elongation of 90%. This film was fired at 130° C. for 30 minutes as it was to produce a wiring board. The height of the wiring was 4 μm, and the resistance value was 16.2Ω (specific electrical resistance value was 4.8×10$^{-6}$Ω·cm). Solder paste LT142 (manufactured by Senju Metal Industry Co., Ltd.) was applied to the mesh electrodes at the both ends in the wiring, lead wires with a clip having an ignorable resistance value were mounted, and then the wiring was preheated at 130° C. for 10 minutes, reflowed at 170° C. for two minutes and slow-cooled to produce a wiring board.

The wiring board was bent at 90° and 180° with the cylindrical rod having a radius of 0.5 mm, and the resistance values for each angles were measured in the same manner as in Example 1. Each resistance values were 120.8Ω and being infinite, and the wiring was disconnected when the wiring board was bent.

Five subjects who had the deformed wiring board attached to the back of hands, arms, necks and the like saw how the wiring board felt during the wearing. The five subjects confirmed that the film had uncomfortable feeling such as hard and stiff to the touch.

Comparative Example 4

By using copper paste CP-1P (manufactured by NOF CORPORATION) of Example 6, wiring was printed on the PET film used in Comparative example 3 and fired for forming wiring having a width of 250 μm in the same manner as in Example 6 in three times attempts. However, the resistance values of the films were infinite and wiring could not be formed. Observing the state of the wiring with a microscope confirmed the wiring breakage in various places.

Example 7

A film with a hardness of 95A in Example 1 was cut into a circle with a diameter of 5 cm, pasted on a glass substrate on a spin coater, and then silver ink NPS-LS (manufactured by Harima Chemicals Group, Inc.) was drop-coated on the film at a spin coater rotation speed of 1000 rpm three times. A square of 2.5 cm in length and 2.5 cm in width was cut out from the film to produce a smooth conductive film. The height of the surface wiring was 1 μm. A lead wire with a clip having an ignorable resistance value was connected to each diagonal end of the film in the same manner as in Example 1. The resistance was measured to give the resistance value of 0.9Ω (specific electrical resistance value of 8.5×10$^{-6}$Ω·cm).

The wiring board was diagonally bent at 90° and 180° with the cylindrical rod having a radius of 0.5 mm, and the resistance values were measured in the same manner as in Example 1. Each resistance values were 0.9Ω and 0.9Ω, which were 30% or less of the electrical resistance before the bending. Therefore, the wiring board was thus proven to be bendable. Furthermore, even after 120 days, there was no migration in the atmosphere at room temperature, and no change in resistance was observed.

Five subjects who had the produced wiring board attached to the back of hands, arms, necks and the like saw how the wiring board felt during the wearing. The five subjects confirmed that the wiring board was flexible, non-sticky, and comfortable to the touch.

Example 8

On single-layer films of the polyurethane used in Example 4 with a film thickness of 100 μm, a 3×15 cm square and having the features below, four wirings as described below were formed with silver paste ECA05 (manufactured by CEMEDINE CO., LTD.), and electrode portions at both ends of each wiring were printed by a letterpress reversal offset printing method, respectively. The polyurethane has the following features: a hardness (asker) of 87A, a glass transition temperature (which was from tan δ peak temperature by dynamic viscoelasticity measurement) of −25° C., a storage elastic modulus by the dynamic viscoelasticity measurement of 27 MPa at 25° C., and a temperature of which the storage elastic modulus reaches to 1 MPa was at 166° C., tensile strength of 36 MPa, and breaking elongation of 520%.

The four wirings individually have (1) Wiring width 1.8 mm, straight wiring length 10.3 cm, and wiring height 13 μm.

(2) Wiring width 1.8 mm, straight wiring length 9.6 cm, and wiring height 9 μm.

(3) Wiring width 1.8 mm, straight wiring length 9.6 cm, and wiring height 9 μm.

(4) Wiring width 1.8 mm, and straight wiring length 10.0 cm.

These films were placed on PET films and fired at 100° C. for 30 minutes to produce wiring boards in which lead wires with a clip having an ignorable resistance value were connected to both ends of each wiring in the same manner as in Example 4.

The resistance values of the wirings are (1) 10.9Ω (specific electrical resistance $\rho^0=2.4\times10^{-5}$ Ω·cm), (2) 13.3Ω (specific electrical resistance $\rho^0=2.3\times10^{-5}$ Ω·cm), (3) 13.2Ω (specific electrical resistance $\rho^0=2.3\times10^{-5}$ Ω·cm), and (4) 11.2Ω (specific electrical resistance $\rho^0=1.8\times10^{-5}$ Ω·cm). As in Example 4, when each wiring board was bent at 90° and 180° with the cylindrical rod having a radius of 0.5 mm, no change in resistance was observed. Independently stretching the wirings (1) by 11.3 cm, (2) by 14.4 cm, (3) by 16.8 cm and (4) by 23.0 cm gave each respective resistance values and each specific electrical resistances of (1) 15.3Ω (specific electrical resistance $\rho=2.6\times10^{-5}$ Ω·cm and $\rho/\rho_0=1.1$), (2) 120Ω (specific electrical resistance $\rho=6.1\times10^{-5}$ Ω·cm and $\rho/\rho_0=2.7$), (3) 170Ω (specific electrical resistance $\rho=5.4\times10^{-5}$ Ω·cm and $\rho/\rho_0=2.4$), and (4) 855Ω (specific electrical resistance $\rho=1.8\times10^{-4}$ Ω·cm and $\rho/\rho_0=6.2$). The function of $\rho/\rho_0$ was $0.2484e^{1.3983\times(draw\ ratio)}$, and its correlation coefficient was 0.965. FIG. 1 shows the relationship. In FIG. 1, the results of the present example are plotted with black circles. Each resistance values of these wirings after stretching (after stress release) are 11.4Ω for (1), 13.9Ω for (2), 12.2Ω for (3), and 10.8Ω for (4). Elastic (stretchable and shrinkable) wiring boards were thus proven to be produced. Furthermore, even after 120 days, the wirings after the stretching suffered no migration in the atmosphere at room temperature, and no change in resistance was observed.

Five subjects who had the produced wiring boards attached to the back of hands, arms, necks and the like saw how the wiring boards felt during the wearing. The five subjects confirmed that the wiring boards were flexible, non-sticky, and comfortable to the touch.

Comparative Example 5

By using the polyurethane single-layer film used in Example 1, a wiring board was produced in the same manner as in Example 8. When the wiring board was to be stretched, it could not be stretched by human hands and was mechanically stretched, but the wiring was not elastic (stretchable and shrinkable) and thus a desired elastic wiring board was not obtained.

Example 9

In place of the polyurethane single-layer films used in Example 8 with a film thickness of 100 μm, a 3×15 cm square, and the polyurethane physical property values in Example 8, used were single-layer films of the polyurethane used in Example 2 and having the features of a hardness (asker) of 86A, a glass transition temperature (which was from tan δ peak temperature by dynamic viscoelasticity measurement) of −45° C., a storage elastic modulus by the dynamic viscoelasticity measurement of 20 MPa at 25° C., and a temperature of which the storage elastic modulus reaches to 1 MPa was at 156° C., tensile strength of 33 MPa, and breaking elongation of 820%. Three wirings as described below were formed, and electrode portions at both ends of each wiring were printed in the same manner as in Example 8.

The three wirings individually have (1) Wiring width 1.3 mm, straight wiring length 9.5 cm, and wiring height 13 μm.

(2) Wiring width 1.3 mm, straight wiring length 9.6 cm, and wiring height 13 μm.

(3) Wiring width 1.3 mm, straight wiring length 9.7 cm, and wiring height 13 μm.

These films were fired in the same manner as in Example 8 to produce wiring boards in which lead wires with a clip having an ignorable resistance value were connected to both ends of each wiring in the same manner as in Example 8.

The resistance values of the wirings are (1) 6.9Ω (specific electrical resistance $\rho^0=1.2\times10-5$ Ω·cm), (2) 15.8Ω (specific electrical resistance $\rho^0=2.8\times10^{-5}$ Ω·cm), and (3) 14.9Ω (specific electrical resistance $\rho^0=2.7\times10^{-5}$ Ω·cm). As in Example 8, when each wiring board was bent at 90° and 180° with the cylindrical rod having a radius of 0.5 mm, no change in resistance was observed. Independently stretching the wirings (1) by 10.5 cm, (2) by 14.4 cm, and (3) by 17.5 cm gave each respective resistance values and each specific electrical resistances of (1) 11.2Ω (specific electrical resistance $\rho=1.5\times10^{-5}$ Ω·cm and $\rho/\rho_0=1.2$), (2) 220Ω (specific electrical resistance $\rho=1.2\times10^{-4}$ Ω·cm and $\rho/\rho_0=4.1$), and (3) 835Ω (specific electrical resistance $\rho=2.5\times10^{-4}$ Ω·cm and $\rho/\rho_0=9.6$). The function of $\rho/\rho_0$ was $0.0573^{2.8451\times(draw\ ratio)}$, and its correlation coefficient was 0.999. FIG. 1 shows the relationship. In FIG. 1, the results of the present example are plotted with black triangles. The resistance values of these wirings after stretching (after stress release) are 7.4Ω for (1), 14.8Ω for (2), and 15.2Ω for (3). Elastic (stretchable and shrinkable) wiring boards were thus proven to be produced. Furthermore, even after 120 days, the wirings after the stretching suffered no migration in the atmosphere at room temperature, and no change in resistance was observed.

Five subjects who had the produced wiring boards attached to the back of hands, arms, necks and the like saw how the wiring boards felt during the wearing. The five subjects confirmed that the wiring boards were flexible, non-sticky, and comfortable to the touch.

Comparative Example 6

By using the polyurethane single-layer film used in Example 3, a wiring board was produced in the same manner as in Example 9. When the wiring board was to be stretched, it could not be stretched by human hands and was mechanically stretched, but the wiring was not elastic (stretchable and shrinkable) and thus a desired elastic wiring board was not obtained.

Example 10

The single-layer film of a polyurethane (manufactured by Mitsui Chemicals, Inc.) used in Example 1 with a hardness (asker) of 85A, a film thickness of 100 μm and a 10 cm square was adhered to a SUS plate, and the plate was attached to a screen printer of Microtech Co., Ltd. Silver paste Dotite XA9521, insulating film XB3212 and silver paste Dotite XA9481 (all manufactured by Fujikura Kasei Co., Ltd.) were printed by using three types of stainless mesh #250 pattern screens at the squeegee speed of 50 mm/sec and the squeegee pressure of 0.25 MPa, as aligning by the camera image in this order. Silver two-layer wiring was formed by firing the printed layers at 150° C. for 30 minutes, 150° C. for 30 minutes, and then 150° C. for 60 minutes, in order of each layers. PEDOT/PSS was applied to a temperature sensor part and dried at 130° C. A board having a wiring configuration as following with a wiring width of 0.1 mm to 2 mm was then produced. The mounted part on the board includes an NFC antenna, an AD conversion module part, an NFC receiver part, a capacitor or amplifier part, a resistor part, the temperature sensor part, and an LED part.

Figure 2:
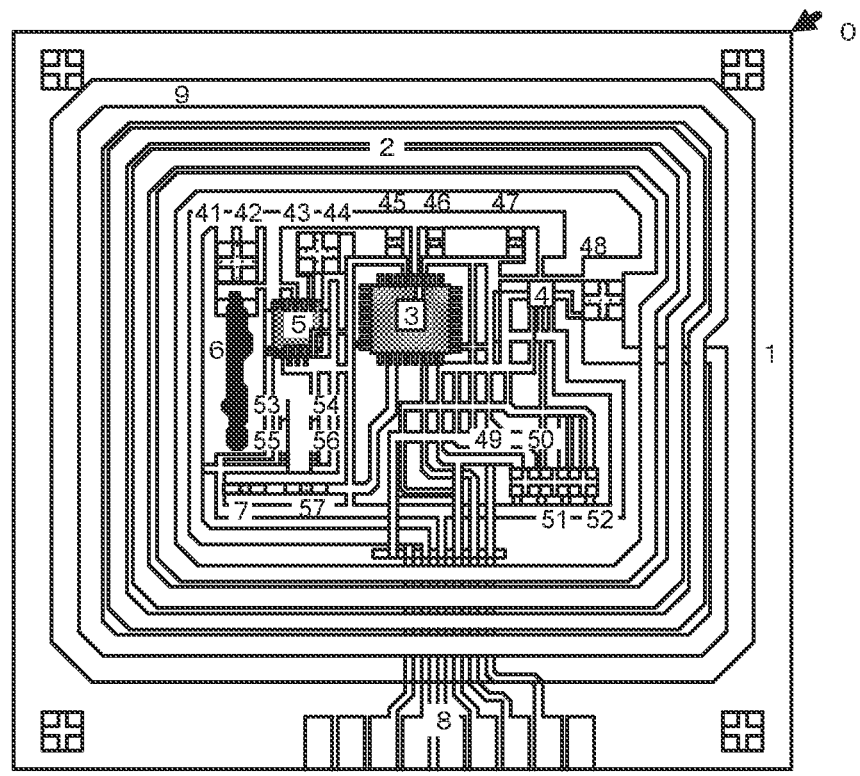
FIG. 2 shows a schematic configuration of a bendable wiring board on a stainless steel plate in Example 10 of the present invention.

FIG. 2 shows the board produced in the present example. Polyurethane single-layer film 1 was adhered to background SUS plate 0, and a silver two-layer wiring was formed on polyurethane single-layer film 1. Further, NFC antenna 2, AD conversion module mounting part 3, NFC receiver mounting part 4, capacitor or amplifier mounting part 5, resistor mounting parts 41 to 57, temperature sensor part (PEDOT/PSS) 6, LED mounting part 7, and resistance measurement electrodes 8 were formed on polyurethane single-layer film 1. Insulating films 9 were disposed between the wirings of the layers.

The resistance value measured from the resistance measuring electrodes with a 4-needle resistance measuring meter was 43 kΩ. The wiring board was bent at 90° and 180° with the cylindrical rod having a radius of 0.5 mm, and the resistance values for each angles were measured in the same manner as in previous examples. Each resistance values were 43Ω and 42Ω, which were 30% or less of the electrical resistance before the bending. Therefore, the wiring board was thus proven to be bendable.

Example 11

On the bendable wiring board of Example 10, in order to mount 17 resistors, an AD conversion module, an NFC receiver, a capacitor or amplifier, and an LED light emitting element, a stainless steel screen having holes aligning to corresponding mounting parts was attached on the screen printer of Microtech Co., Ltd. Solder paste LT142 (manufactured by Senju Metal Industry Co., Ltd.) was applied to the parts of the bendable wiring board, and after mounting corresponding electrical components, the bendable wiring board was preheated at 130° C. for 10 minutes, reflowed at 170° C. for 2 minutes, and slow-cooled, thereby producing an electronic device of FIG. 3 having an NFC communication function with a temperature sensor function.

Figure 3:
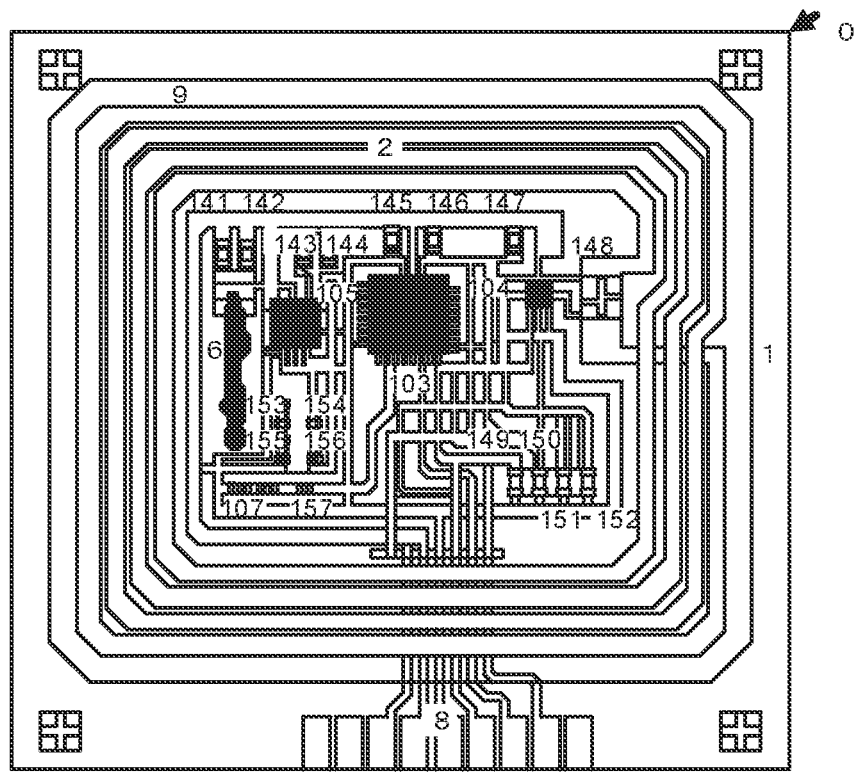
FIG. 3 shows a schematic configuration of a bendable electronic device having a sensor function and a short-range wireless communication function on a stainless steel plate in Example 11 of the present invention.

FIG. 3 shows the electronic device produced in the present example. AD conversion module 103, NFC receiver 104, amplifier 105, capacitors or resistors 141 to 157, and LED light emitting element 107 are mounted on the board shown in FIG. 2.

When the epidermis temperature of a human body was measured by using an NFC temperature measurement application (which was designed and developed by Tokito Laboratory, Research Center for Organic Electronics, Yamagata University) installed on GalaxyS7 and by placing the electronic device so as to be bent between the fingers on the back side at room temperature of 23° C. through NFC communication, the temperature was 30.7° C. At the same time, when the same part was measured with an infrared laser thermometer gun (manufactured by HIOKI E. E. CORPORATION), the temperature was 30.7° C. Therefore, the electronic device was thus proven to be a bendable electronic device with a temperature sensor function and a communication function. Furthermore, even after 120 days, there was no migration in the atmosphere at room temperature, the electronic device was thus proven to work normally.

Five subjects who had the produced wiring board attached to the back of hands, arms, necks and the like saw how the wiring board felt during the wearing. The five subjects confirmed that the wiring board was flexible, non-sticky, and comfortable to the touch.

Example 12

In place of the polyurethane single-layer film used in Example 10, a single-layer film having a hardness (asker) of 86A used in Example 2 was used. A board having wiring formed thereon was produced in the same manner as in Example 10 except that the silver paste ECA05 of Example 8 was used in place of silver paste Dotite XA9521 among silver paste Dotite XA9521, insulating film XB3212 and silver paste Dotite XA9481, and the wiring of the first layer was fired at 120° C.

The resistance value measured from the resistance measuring electrodes with a 4-needle resistance measuring meter was 45 kΩ. The wiring board was bent at 90° and 180° with the cylindrical rod having a radius of 0.5 mm, and the resistance values for each angles were measured in the same manner as in previous examples. Each resistance values were 45Ω and 45Ω. Furthermore, the resistance value after stretching the wiring board by pulling it diagonally was 46 kΩ, and the resistance value did not change. Therefore, the wiring board was thus proven to be an elastic (stretchable and shrinkable) wiring board.

Example 13

On the elastic (stretchable and shrinkable) wiring board produced in Example 12, an electronic device having an NFC communication function with a temperature sensor function was produced as in Example 11. When the epidermis temperature of a human body was measured by using the NFC temperature measurement application and by placing the electronic device so as to be bent between the fingers on the back of hand at room temperature of 23° C. through NFC communication in the same manner as in Example 11, the temperature was 31.3° C. At the same time, when the same part was measured with the infrared laser thermometer gun, the temperature was 30.7° C. The electronic device was thus proven to be an elastic (stretchable and shrinkable) electronic device with a temperature sensor function and a communication function. Furthermore, even after 120 days, there was no migration in the atmosphere at room temperature, the electronic device was thus proven to work normally.

Five subjects who had the produced wiring board attached to the back of hands, arms, necks and the like saw how the wiring board felt during the wearing. The five subjects confirmed that the wiring board was flexible, non-sticky, and comfortable to the touch.

This application claims priority based on Japanese Patent Application No. 2018-204920, filed on Oct. 31, 2018, the entire contents of which including the specification, the claims and the drawings are incorporated herein by reference.

INDUSTRIAL APPLICABILITY

A bendable wiring board, an elastic (stretchable and shrinkable) wiring board, and a bendable or elastic electronic device, which is provided with the wiring boards and equipped with a sensor function and a short-range wireless communication function, of the present invention have excellent bendability, elasticity and high transparency, and suffer no yellowing over time, thus can be used for welfare medical applications, wearable device applications, RFID applications, transistor applications for, for example, smartphones, tablet terminals, computers and displays, applications of sensors or control parts for, for example, medical and nursing beds, crime prevention, childcare, autonomous driving, pet robots and drones, and applications of electronic parts for, for example, organic EL, liquid crystal displays, lighting, automobiles, robots, electronic glasses and music players. The wiring boards and the electronic device may be used as electronic devices with a sensor function which are flexible, non-sticky, and comfortable to the touch for the human body.

REFERENCE SIGNS LIST

0 SUS plate
1 Polyurethane single-layer film
2 NFC antenna
3 AD conversion module mounting part
41 to 57 capacitor or resistor mounting part
6 Temperature sensor part (PEDOT/PSS)
7 LED mounting part
8 Measurement electrode
9 Insulating layer
103 AD conversion module
104 NFC receiver
105 amplifier
141 to 157 Capacitor or resistor
107 LED light emitting element

The invention claimed is:

1. A bendable wiring board, comprising:
a film composed of a polyurethane to be synthesized by allowing a long-chain polyol to react with a polyisocyanate, wherein
a temperature of the polyurethane at which a storage elastic modulus measured by a dynamic viscoelasticity measurement becomes 1 MPa is 155° C. or higher, and the polyurethane has
the storage elastic modulus of 20 to 200 MPa at 25° C.,
a tensile strength of 20 to 80 MPa, and
elongation at break of 500 to 900%; and
circuit wiring formed so as to be in contact with a surface of the film.

2. The bendable wiring board according to claim 1, wherein the polyisocyanate has a constituent unit derived from 1,4-bis(isocyanatomethyl)cyclohexane with a trans isomer at a proportion of 70% to 95%.

3. The bendable wiring board according to claim 1, wherein the long-chain polyol has a number average molecular weight of 500 to 3,500.

4. The bendable wiring board according to claim 1, wherein the polyurethane is a thermoplastic polyurethane, and the film is a single-layer film.

5. An elastic (stretchable and shrinkable) wiring board, comprising:
a film composed of a polyurethane to be synthesized by allowing a long-chain polyol to react with a polyisocyanate, wherein
a temperature of the polyurethane at which a storage elastic modulus measured by a dynamic viscoelasticity measurement becomes 1 MPa is 155° C. or higher, and the polyurethane has
the storage elastic modulus of 20 to 200 MPa at 25° C.,
a tensile strength of 20 to 40 MPa, and
elongation at break of 500 to 900%; and
circuit wiring formed so as to be in contact with a surface of the film, wherein
a ratio $\rho/\rho_0$ between a specific electrical resistance ($\Omega \cdot cm$) $\rho_0$ of the circuit wiring before the circuit wiring is stretched and a specific electrical resistance $\rho$ of the circuit wiring when the circuit wiring is stretched and changed is in a range of 1.05 to 10.0.

6. The elastic wiring board according to claim 5, wherein the polyisocyanate has a constituent unit derived from 1,4-bis(isocyanatomethyl)cyclohexane with a trans isomer at a proportion of 70% to 95%.

7. The elastic wiring board according to claim 5, wherein the long-chain polyol has a number average molecular weight of 500 to 3,500.

8. The elastic wiring board according to claim 5, wherein the polyurethane is a thermoplastic polyurethane, and the film is a single-layer film.

9. A bendable or elastic electronic device, comprising:
the bendable wiring board according to claim 1;
a sensor that measures a predetermined physical quantity; and
a wireless communication device.

10. The bendable or elastic electronic device according to claim 9, wherein the wireless communication device includes a short-range wireless communication function.

11. The bendable or elastic electronic device according to claim 9, wherein the sensor is a temperature sensor.

12. A bendable or elastic electronic device, comprising:
the elastic wiring board according to claim 5;
a sensor that measures a predetermined physical quantity; and
a wireless communication device.

13. The bendable or elastic electronic device according to claim 12, wherein the wireless communication device includes a short-range wireless communication function.

14. The bendable or elastic electronic device according to claim 12, wherein the sensor is a temperature sensor.

* * * * *